United States Patent
Chen et al.

(10) Patent No.: US 8,411,482 B2
(45) Date of Patent: Apr. 2, 2013

(54) PROGRAMMABLE READ ONLY MEMORY

(75) Inventors: Zhanping Chen, Portland, OR (US);
Sarvesh Kulkarni, Hillsboro, OR (US);
Kevin Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 481 days.

(21) Appl. No.: 12/229,117

(22) Filed: Aug. 20, 2008

(65) Prior Publication Data

US 2010/0046269 A1    Feb. 25, 2010

(51) Int. Cl.
*G11C 17/00* (2006.01)
*G11C 17/14* (2006.01)
*G11C 17/16* (2006.01)
*G11C 17/18* (2006.01)

(52) U.S. Cl. ........... 365/96; 365/225.7; 365/51; 365/63; 365/72

(58) Field of Classification Search ............... 365/225.7, 365/51, 63, 72, 96
See application file for complete search history.

(56) References Cited

U.S. PATENT DOCUMENTS

| | | | | |
|---|---|---|---|---|
| 5,953,242 A | * | 9/1999 | Kitsukawa et al. | 365/51 |
| 6,208,549 B1 | * | 3/2001 | Rao et al. | 365/96 |
| 6,258,700 B1 | * | 7/2001 | Bohr et al. | 438/467 |
| 6,876,594 B2 | * | 4/2005 | Griesmer et al. | 365/225.7 |
| 6,911,360 B2 | * | 6/2005 | Li et al. | 438/238 |
| 2007/0280012 A1 | * | 12/2007 | Obayashi et al. | 365/200 |
| 2008/0316789 A1 | * | 12/2008 | Fredeman et al. | 365/96 |

FOREIGN PATENT DOCUMENTS

| | | |
|---|---|---|
| KR | 10-2007-0114046 | 11/2007 |
| WO | 2007/027607 A2 | 3/2007 |

OTHER PUBLICATIONS

Office Action for Korean Patent Application 10-2009-76618, mailed Jan. 14, 2011, 7 pages.
Office Action for Korean Patent Application 10-2009-76618, mailed Sep. 9, 2011, 4 pages.

* cited by examiner

*Primary Examiner* — J. H. Hur
(74) *Attorney, Agent, or Firm* — Schwabe, Williamson & Wyatt, P.C.

(57) ABSTRACT

A memory cell includes a fuse and at least one transistor. The transistor is used to control the programming or sensing of the fuse. A program voltage is applied to a stack of first and second conductive layers. A first portion of the stack couples the program voltage to a terminal of the transistor in a cell. A second portion of the stack couples the program voltage to a terminal of the transistor in another cell.

24 Claims, 12 Drawing Sheets

PROGRAMMABLE READ ONLY MEMORY

FIELD

The subject matter disclosed herein relates generally to the field of memory devices.

RELATED ART

Programmable read only memory (PROM) devices are typically used to configure and test integrated circuit devices, such as microprocessors, and to test and configure memory cache. Fuse arrays are presently utilized in PROM devices to store information.

BRIEF DESCRIPTION OF THE DRAWINGS

Embodiments of the present invention are illustrated by way of example, and not by way of limitation, in the drawings and in which like reference numerals refer to similar elements.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In one embodiment, a programmable ROM (PROM) array may include an array of memory cells arranged in rows and columns. Each memory cell may include a PMOS transistor and a programmable fuse. In one embodiment, a program terminal of each memory cell is coupled to a power supply through stacked conductive layers, where each layer is conductively coupled using one or more via.

Figure 1A:
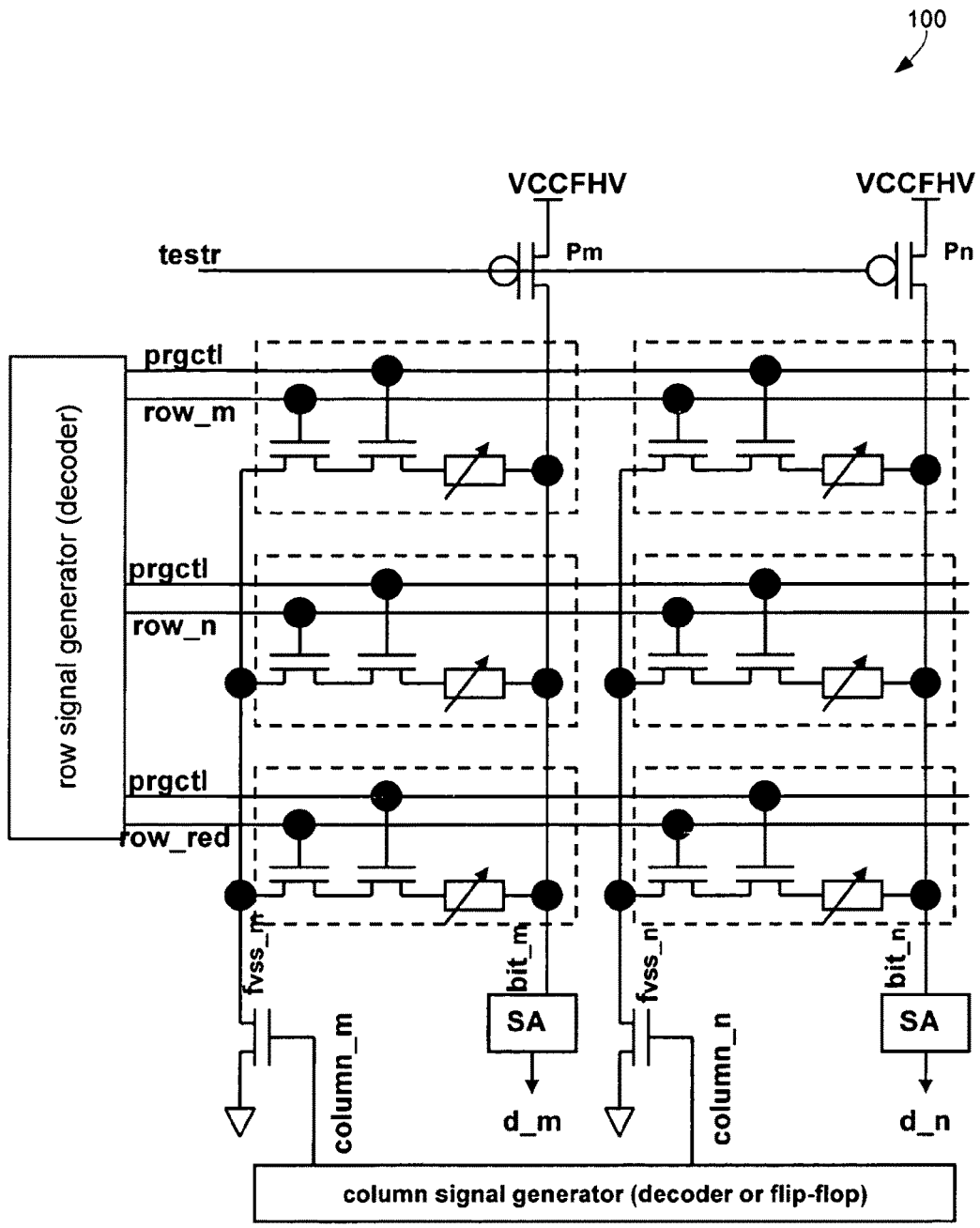
FIG. 1A depicts a prior art PROM array.

FIG. 1A depicts a prior art PROM array 100. PROM array 100 includes cells that use fuse elements and series connected NMOS transistors. The fuse elements can be made by polysilicon, metal, or other material. A metal layer couples program terminal VCCFHV to the drain terminals of memory cells and couples VSS (also called ground) to the source terminals of memory cells in a column.

Figure 1B:
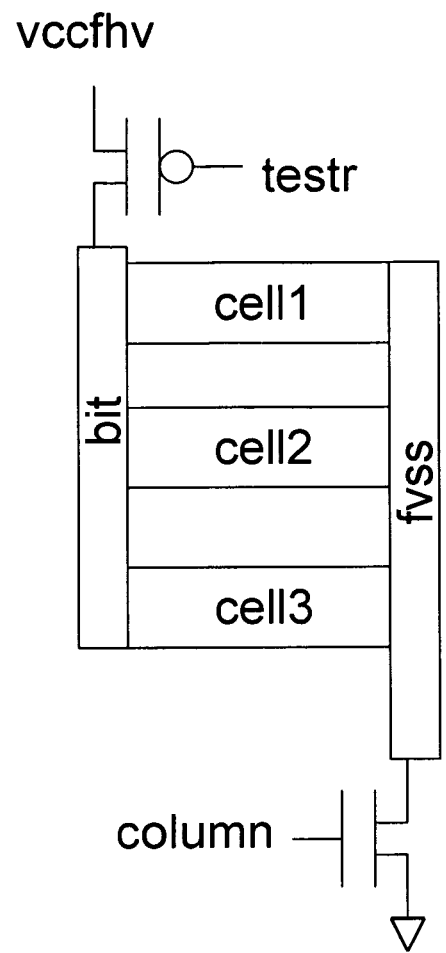
FIG. 1B depicts a simplified example of a prior art manner to connect source terminals of cells to a program voltage terminal.

FIG. 1B depicts a simplified example of a prior art manner that uses a metal layer to connect source terminals of cells to a program voltage terminal. Because of the use of the metal layer to couple source terminals to the ground (e.g., VSS), PROM array 100 may experience row dependency such that memory cells further from VSS may operate poorly compared to memory cells closer to VSS.

Figure 1C:
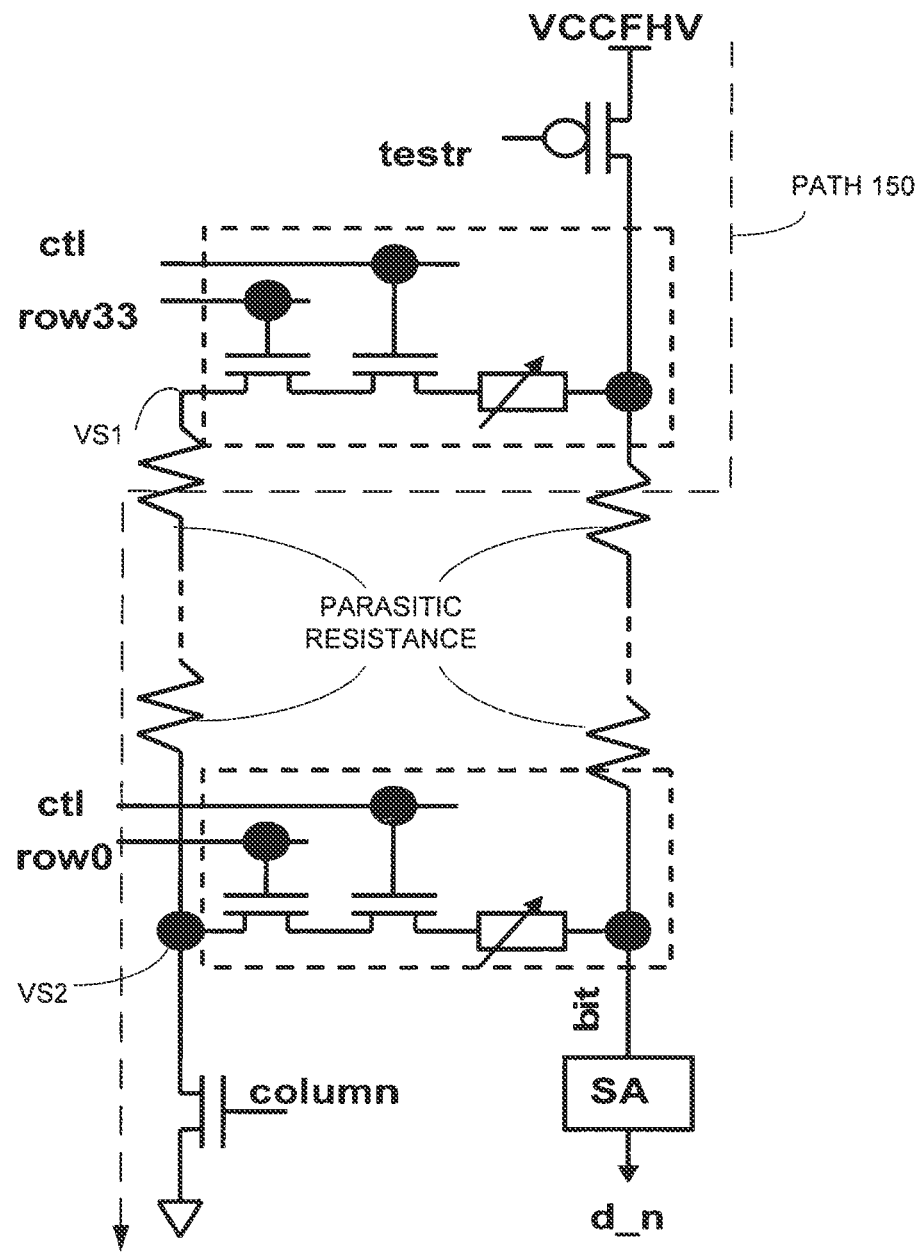
FIG. 1C depicts an example of row dependency whereby voltages at source terminals of different memory cells experience different voltages.

FIG. 1C depicts an example of row dependency whereby voltages at source terminals of different memory cells in the same column experience different voltages. To turn on a transistor in a memory cell, the gate voltage must exceed the source voltage by at least the threshold voltage for the transistor. Because of parasitic resistance along path 150, the source voltage VS1 for a cell in row 33 is much higher than the source voltage VS2 for a cell in row 0. Due to the lower source voltage VS2 for a cell in row 0, the cell in row 0 may function properly. However, the high source terminal voltage VS1 causes reverse body bias leading to much higher device threshold voltage, thus smaller program current through the NMOS transistors for the cell in row 33 than that in row 0. A low current through the cell may not program the cell's fuse. Therefore, during reading of the cell, a sense amplifier may not detect the programmed state of the fuse, thereby compromising fuse yield.

To reduce row dependency and improve memory cell yield, various techniques can be used. One technique involves use of a higher program voltage at terminal VCCFHV so that cells in higher numbered rows (e.g., rows further from the ground (VSS)) are more likely to operate. However, this higher program voltage can cause device reliability concerns and also increase junction leakage during fuse programming. A higher program voltage may also cause some fuse cells in lower numbered rows to be over burned and affect yield and fuse reliability.

Another technique is to set the programming voltage to a lower voltage that is based on the lower rows (e.g., rows closer to the ground). However, the lower voltage may not be sufficient to program the cells in the higher rows.

Figure 2A:
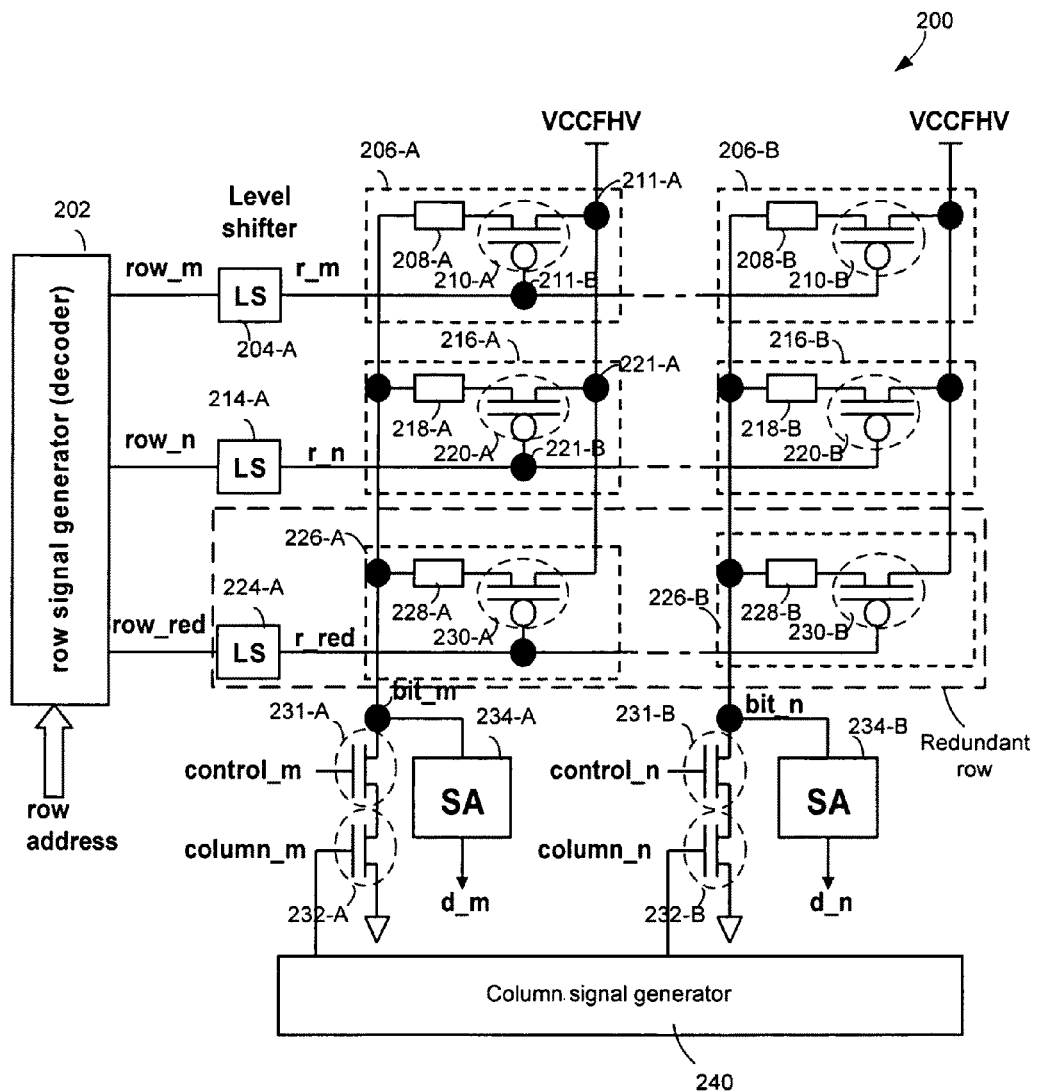
FIG. 2A depicts a PROM array, in accordance with an embodiment of the present invention.

FIG. 2A depicts a PROM array 200, in accordance with an embodiment of the present invention. Array 200 includes cells addressable by row and column select signals. In one embodiment, a cell (e.g., 206-A, 206-B, 216-A, 216-B, 226-A, and 226-B) includes a fuse (e.g., 208-A, 208-B, 218-A, 218-B, 228-A, and 228-B) and a transistor (e.g., 210-A, 210-B, 220-A, 220-B, 230-A, and 230-B). In one embodiment, the fuse may be made from any material known in the art, including polysilicon and various metals. In one embodiment, the transistor may be any transistor, such as a PMOS transistor, a vertical drain NMOS (also called VDNMOS), or a vertical source and drain NMOS (also called VSDNMOS).

Array 200 may include one or more redundant row of cells. Redundant rows can be used to repair one or more defective rows to meet process and fuse yield targets for the array 200.

Figure 2B:
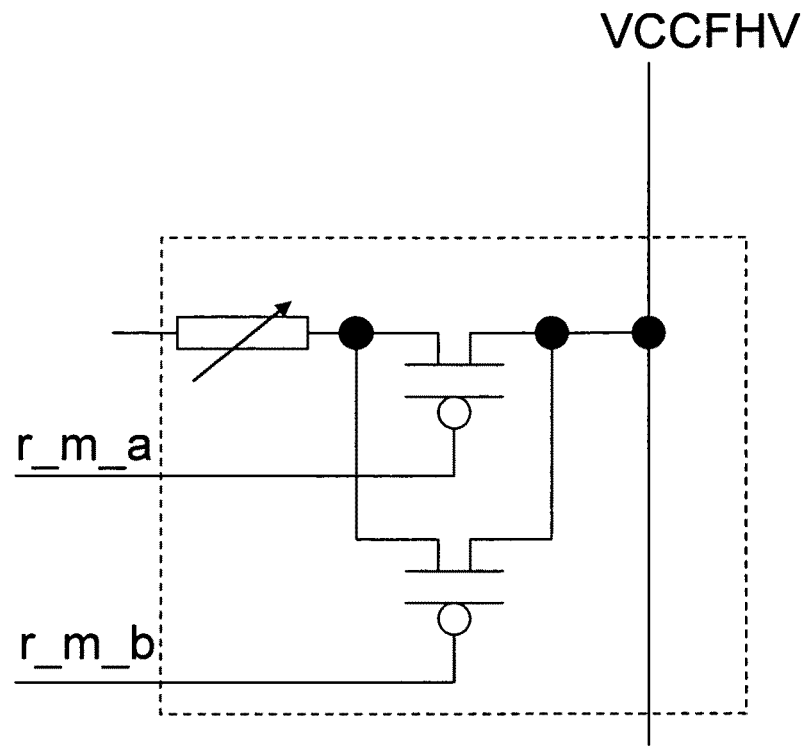
FIG. 2B depicts an embodiment of a PMOS transistor, in accordance with an embodiment of the present invention.

FIG. 2B depicts an embodiment of a PMOS transistor that can be used in a cell, in accordance with an embodiment of the present invention. In this embodiment, a single PMOS in a cell can be divided into multiple PMOS devices with source terminals tied together, drain terminals tied together, and gate terminals tied to separate terminals. In another implementation, the gate terminals can be tied together and to the same terminal.

Figure 2C:
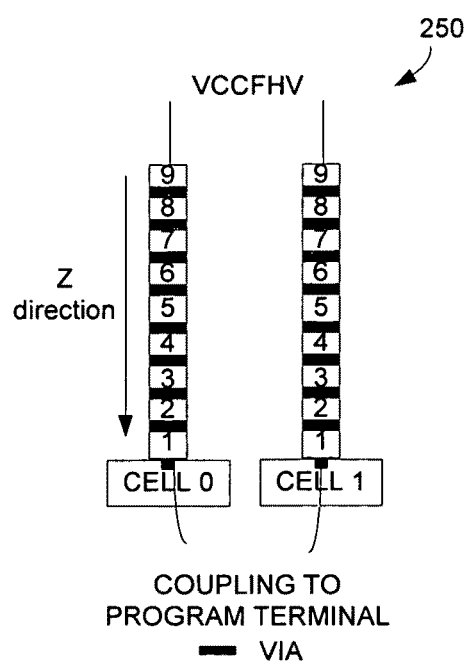
FIG. 2C depicts a simplified cross section perspective of an example semiconductor structure with metal layers that are conductively coupled to cells, in accordance with an embodiment of the present invention.

Both the substrate and source terminal (e.g., 211-A and 221-A) of each transistor may be conductively coupled to terminal VCCFHV. In one embodiment, the technique described with regard to FIG. 2C may be used to couple terminal VCCFHV to the source terminal of each transistor. FIG. 2C depicts a simplified cross section perspective of an example semiconductor structure 250 with conductive layers 1 to 9 that conductively couple a program voltage terminal to program terminals of cells, in accordance with an embodiment of the present invention. Semiconductor structure 250 includes multiple conductive layers 9 to 1 that are conductively coupled using vias. Although not depicted, conductive layers are arranged in a criss-crossing manner so that the conductive layer in every other row is parallel. Accordingly, although not depicted, the conductive layers 2, 4, 6, and 8 of the two stacks depicted would be continuous. The stack of conductive layers 9 to 1 and vias conductively couple a program voltage terminal (e.g., VCCFHV) to the source terminal of the transistor of a cell 0. Another stack of conductive layers 9 to 1 and vias conductively couples the program voltage terminal (e.g., VCCFHV) to the source terminal of the transistor of a cell 1. Another embodiment of the stacks may have 10 or more metal layers. In that case layer 9 becomes the highest numbered metal layer.

Accordingly, a shorter conductive path may be available from a program voltage terminal to a program terminal of a memory cell using the stacks of FIG. 2C than the conductive path of FIG. 1B. Use of the conductive path of FIG. 2C may reduce variations in source terminal voltages that are caused by parasitic resistance. Hence, row dependency may be reduced because of reduced parasitic resistance. Because of the reduced row dependency, a single programming voltage at terminal VCCFHV can be used to program all cells in an array. Moreover, with the reduction of row dependency, the program voltage for cells in array 200 (FIG. 2A) can be reduced compared to that with regard to cells in array 100 (FIG. 1A).

Referring again to FIG. 2A, the gate terminal (e.g., 211-B and 221-B) of each PMOS transistor may be coupled to receive a row select signal. In one implementation, gate terminals of transistors of memory cells can be coupled to a row select signal.

Array 200 may include row and column decoding logic circuits to select a particular cell for programming or sensing. When each column shares the sensing circuitry for the programmed memory cell, a single row may be read at a time. Data from cells in column m and n are represented as bit_m and bit_n, respectively.

Row signal generator 202 provides a row select signal (e.g., row_m, row_n, and row_red) to a level shifter (e.g., LS 204-A, LS 214-A, and LS 224-A). When a cell is not selected for programming, a level shifter transforms the voltage VCC to VCCFHV to turn off the PMOS transistor. When a cell is selected for programming or sensing, its row select signal is set to ground to turn on the PMOS transistor in the memory cell. After programming of a cell, terminal VCCFHV is tied to VCC, a level shifter acts as a regular inverter or buffer without applying voltage conversion.

Column signal generator 240 provides a column select signal to a selected column. The selected column receives the column select signal at a series connected NMOS transistor formation (e.g., 231-A and 232-A or 231-B and 232-B). The series connected NMOS transistor formation is controlled by a column select signal from column signal generator 240. The gate of the top NMOS (e.g., 231-A and 231-B) in the series connected formation is tied to a control signal which is held at regular VCC during programming. The gates of the series connected NMOS transistors 231-A, 232-A, 231-B, and 232-B operate from VSS to regular VCC. VSS may be set to ground. During standby mode, the gate terminals of the both series connected NMOS transistors may be set to at VSS to shut off the fuse array to reduce leakage.

Although not shown, row signal generator 202 and column signal generator 240 may be implemented using scan flip-flops or counters to provide the desired coding.

Figure 2D:
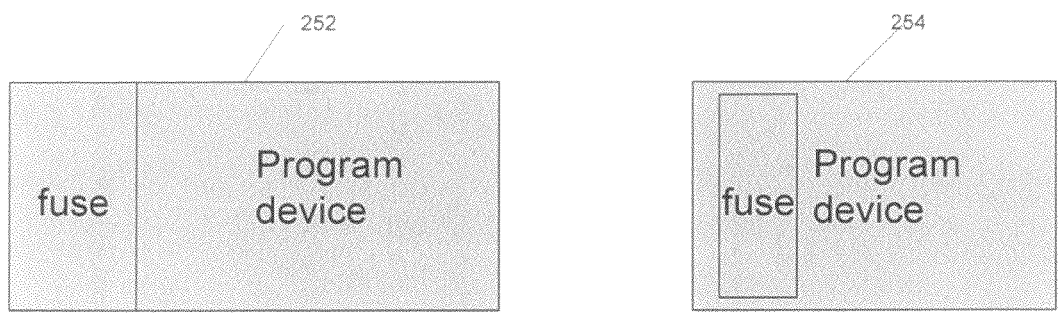
FIG. 2D depicts a top down perspective of manners of arranging a fuse relative to a program device, in accordance with an embodiment of the present invention.

FIG. 2D depicts a top down perspective of manners of arranging a fuse relative to a program device, in accordance with an embodiment of the present invention. Structure 252 has a fuse placed adjacent to a program device (e.g., one or more PMOS transistor) whereas structure 254 has a fuse placed over a program device (e.g., one or more PMOS transistor). In structure 252, fuse and program device are placed next to each other in the horizontal direction, taking more horizontal area. In structure 254, the fuse is stacked vertically on top of or below the program device, taking less horizontal area. Fuse bit cells with substantially lower area may result.

Figure 2E:
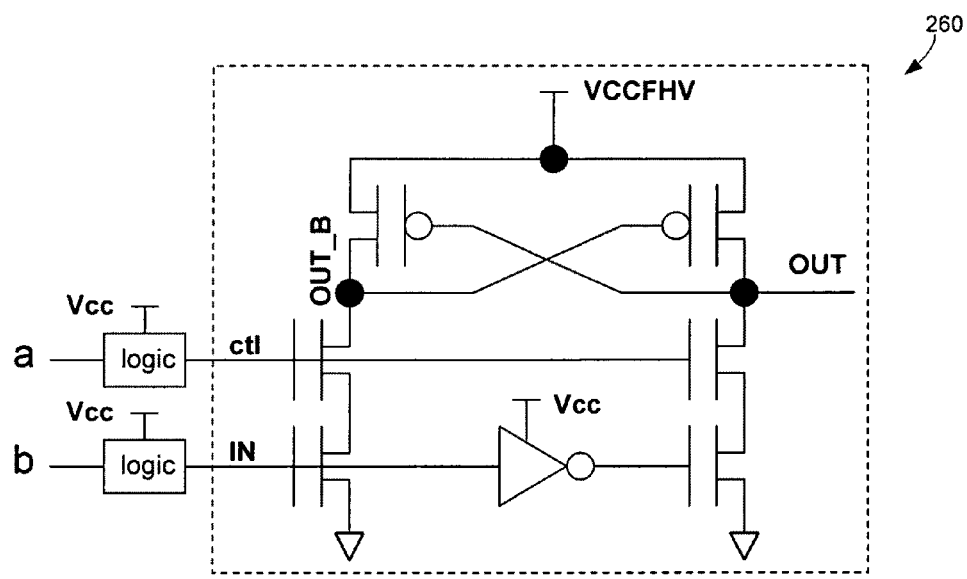
FIG. 2E depicts an example of a level shifter, in accordance with an embodiment of the present invention.

FIG. 2E depicts an example of a level shifter 260, in accordance with an embodiment of the present invention. Terminal b receives a row select signal (e.g., row_m, row_n, or row_red). Terminal OUT provides a row signal (e.g., r_m, r_n, or r_red) to the row to control the gate of the PMOS device in a memory cell.

Figure 2F:
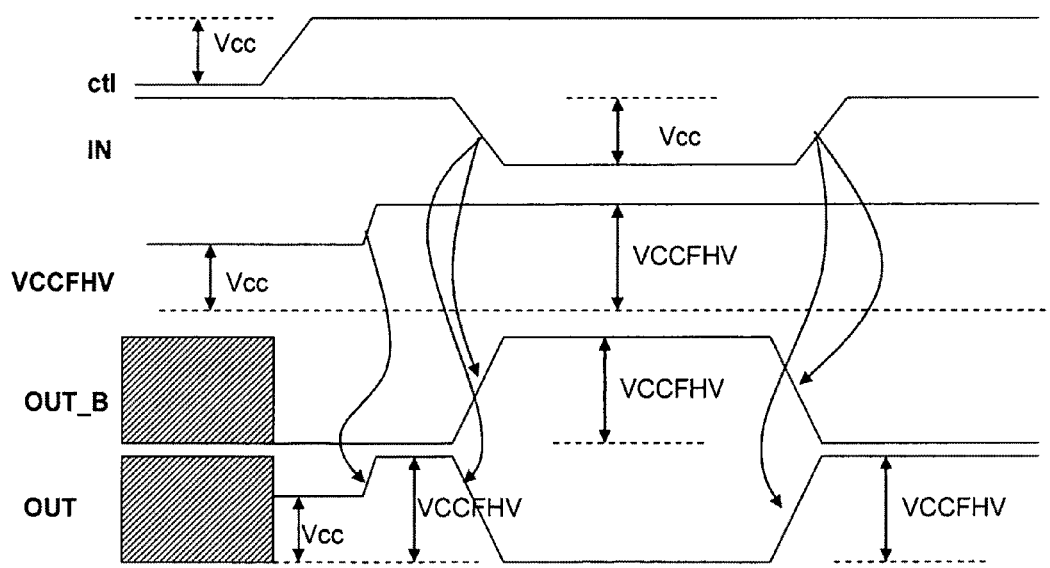
FIG. 2F depicts an example of signals generated to operate a level shifter, in accordance with an embodiment of the present invention.

FIG. 2F depicts an example of signals generated to operate a level shifter during programming of a memory cell, in accordance with an embodiment of the present invention. After a program control signal ctl rises to voltage level Vcc, the voltage at terminal VCCFHV rises from Vcc to VCCFHV. An increase of the voltage at terminal VCCFHV to level VCCFHV causes a voltage at terminal OUT to increase to level VCCFHV to turn off the PMOS of each memory cell. Selection of a row for programming causes the signal at terminal IN to fall to VSS, which causes the signal at terminal OUT to fall to VSS. After programming of the cell, the voltage at terminal IN rises to Vcc, which causes the voltage at terminal OUT to rise to VCCFHV.

Figure 2G:
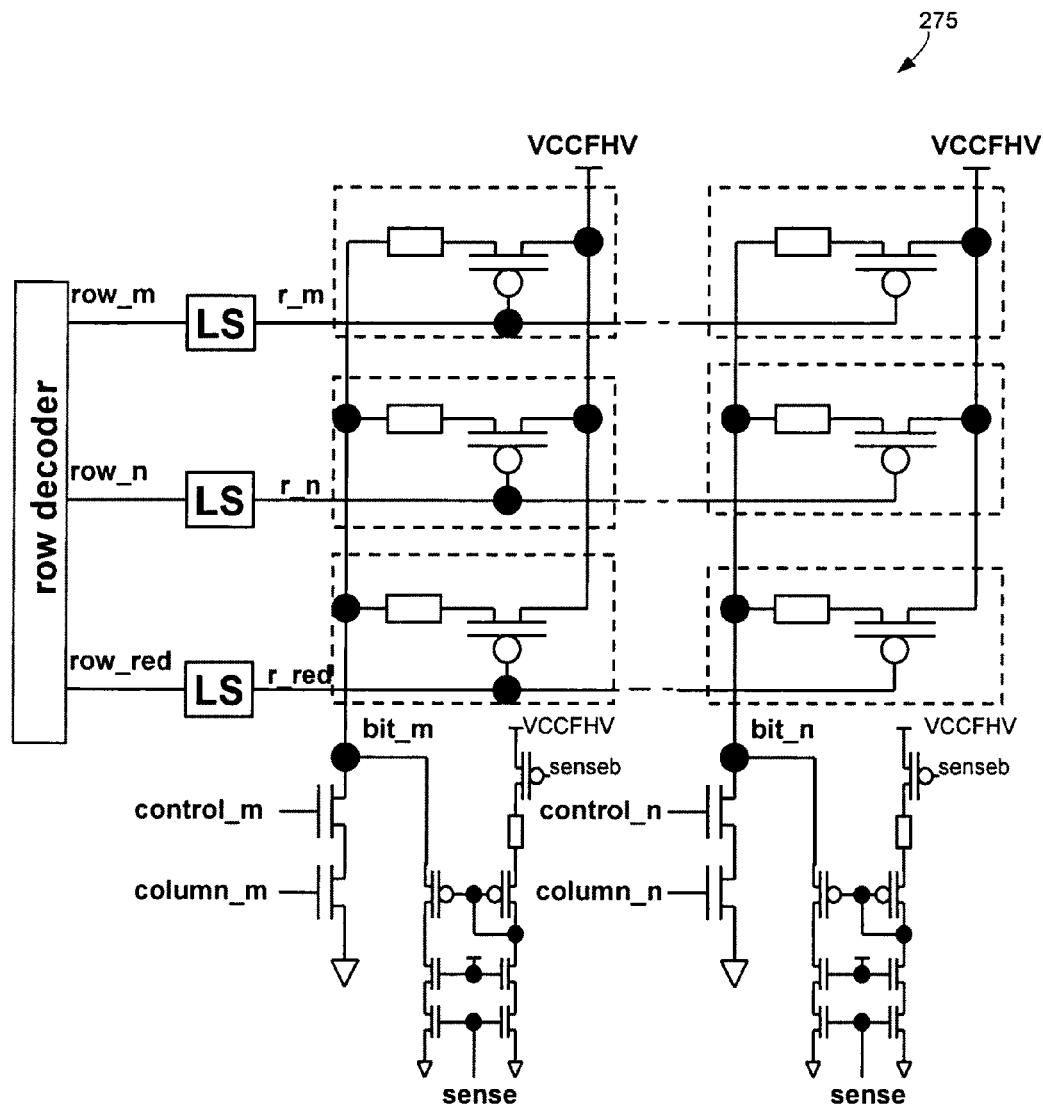
FIG. 2G depicts another embodiment of a PROM array, in accordance with an embodiment of the present invention.

FIG. 2G depicts one embodiment of a PROM array 275 that shows sense amplifiers, in accordance with an embodiment of the present invention.

Figure 2H:
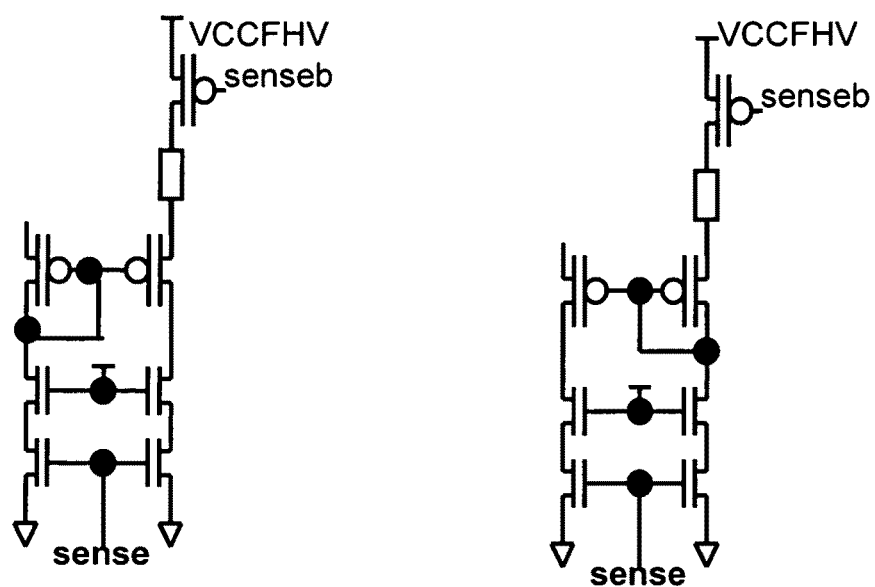
FIG. 2H depicts configurations of sense amplifiers, in accordance with an embodiment of the present invention.

FIG. 2H depicts two configurations of sense amplifiers, in accordance with an embodiment of the present invention. Signal senseb is an inverted version of signal sense.

Figure 3:
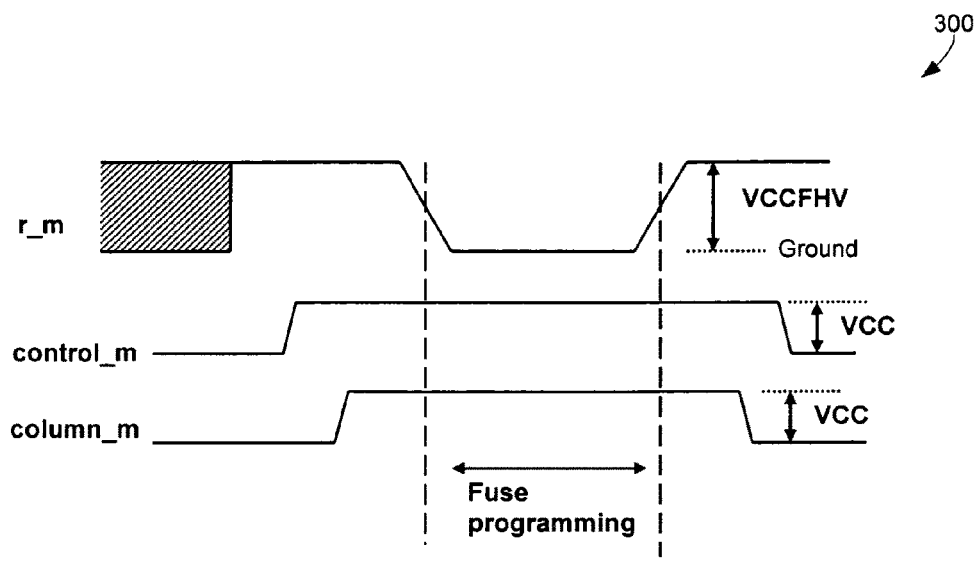
FIG. 3 depicts a timing diagram of signals generated during a programming of a cell in a PROM array, in accordance with an embodiment of the present invention.

FIG. 3 depicts a timing diagram of signals generated during a programming of a cell in a PROM array, in accordance with an embodiment of the present invention. The example of FIG. 3 is for programming a cell positioned at row m and column m. Signal r_m transitions from voltage VCCFHV to VSS. Program control signal control_m transitions to VCC to turn on NMOS transistor 231-A. In addition, column select signal column_m transitions to VCC to turn on NMOS transistor 232-A. The gate of transistor 210-A is coupled to signal r_m. Both the substrate and source of PMOS transistor 210-A of the cells are initially at the same voltage level of VCCFHV. A voltage VSS at the gate of transistor 210-A turns on transistor 210-A. A current flows through fuse element 208-A in the selected cell thereby programming fuse element 208-A to create a large post-burn resistance in the fuse. For the unselected rows (e.g., row n and redundant row), the gates of transistors are at VCCFHV so such transistors are turned off.

Note that FIG. 3 shows column_m switches to VCC before r_m changes to VSS. However, this order is not required. Signals Column_m and r_m may switch at different times. Accordingly, signal r_m may switch to VSS before column_m switches to VCC.

Figure 4:
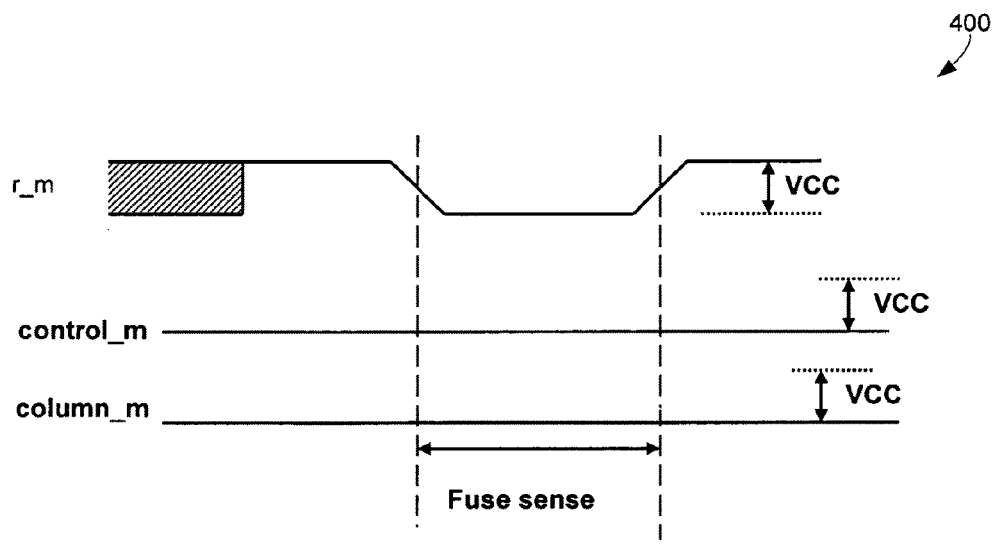
FIG. 4 depicts a timing diagram of signals generated during a reading mode of a cell in a PROM array, in accordance with an embodiment of the present invention.

FIG. 4 depicts a timing diagram of signals during a reading (sensing) mode of a cell in a PROM array, in accordance with an embodiment of the present invention. The example of FIG. 4 is for reading stored contents of cells positioned at row m. In this example, cells of an entire row can be read out at the same time. All column select signals (e.g., signals control_m and column_m) may be turned off to read all cells in a row. Signal r_m changes from voltage VCC to VSS. When signal r_m is at voltage VSS, PMOS transistors in row m are turned on, causing current to conduct through fuses in row m. By turning on each row, the fuse resistance in each cell in a row can be compared with the reference fuse resistance inside the sense amplifier to output a digital value. All cells in the same row can be read at the same time because each cell in the same row has a different sense amplifier to compare the programmed fuse with the reference fuse inside the respective sense amplifier. The digital data from the sense amplifier can be stored into digital storage devices such as flip-flops.

Figure 5:
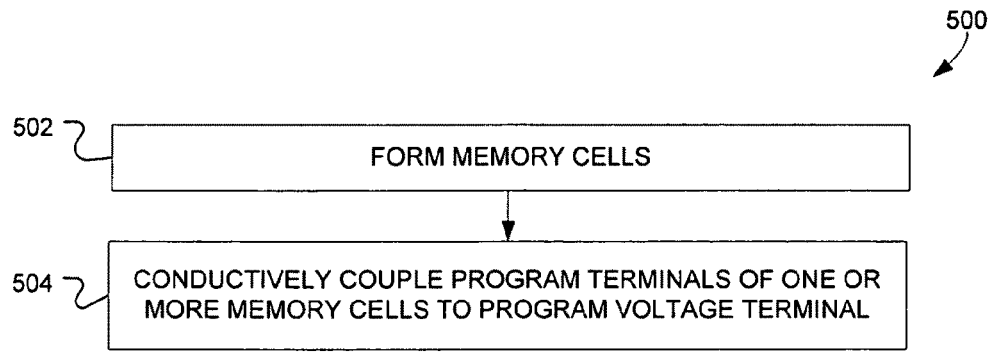
FIG. 5 depicts a flow diagram of a manner to construct an array of memory cells, in accordance with an embodiment of the present invention.

FIG. 5 depicts a flow diagram of a manner to construct an array of memory cells, in accordance with an embodiment of the present invention. Block 502 may include forming multiple memory cells. In one embodiment, a memory cell may be formed in the same manner as cell 206-A.

Block 504 may include conductively coupling program terminals of the memory cell to a program voltage terminal. In one embodiment, the program terminal may be a source terminal of a PMOS transistor. The metal layer may couple a program voltage to the source terminal of one or more memory cell. For example, the metal layer may couple the program voltage to a source terminal in the manner described with regard to FIG. 2B.

Figure 6:
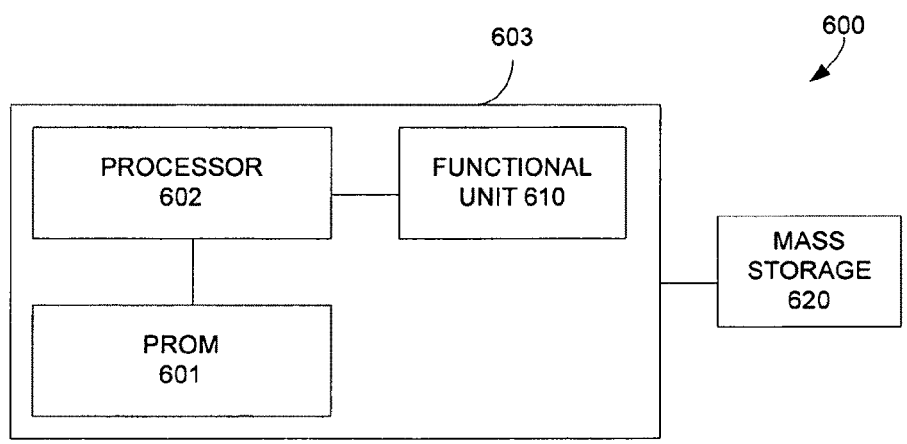
FIG. 6 depicts an example a system that incorporates a PROM utilizing a fuse cell array according to one embodiment of the present invention.

FIG. 6 depicts an example a system that incorporates a PROM utilizing a fuse cell array according to one embodiment of the present invention. As shown, system 600 may include an integrated circuit 603 having PROM 601, and one or more mass storage devices 620 coupled to the integrated circuit 603. In various embodiments, integrated circuit 603 may be a microprocessor or an Application Specific Integrated Circuit (ASIC). As discussed previously, PROM 601 may include a fuse cell array described herein. System 600 may be embodied in a broad range of form factors from servers, to desktop, laptop, tablet, and/or handheld computer. Further, system 600 may be endowed with various operating systems and/or applications to solve various computing and/or communication problems.

Figure 7:
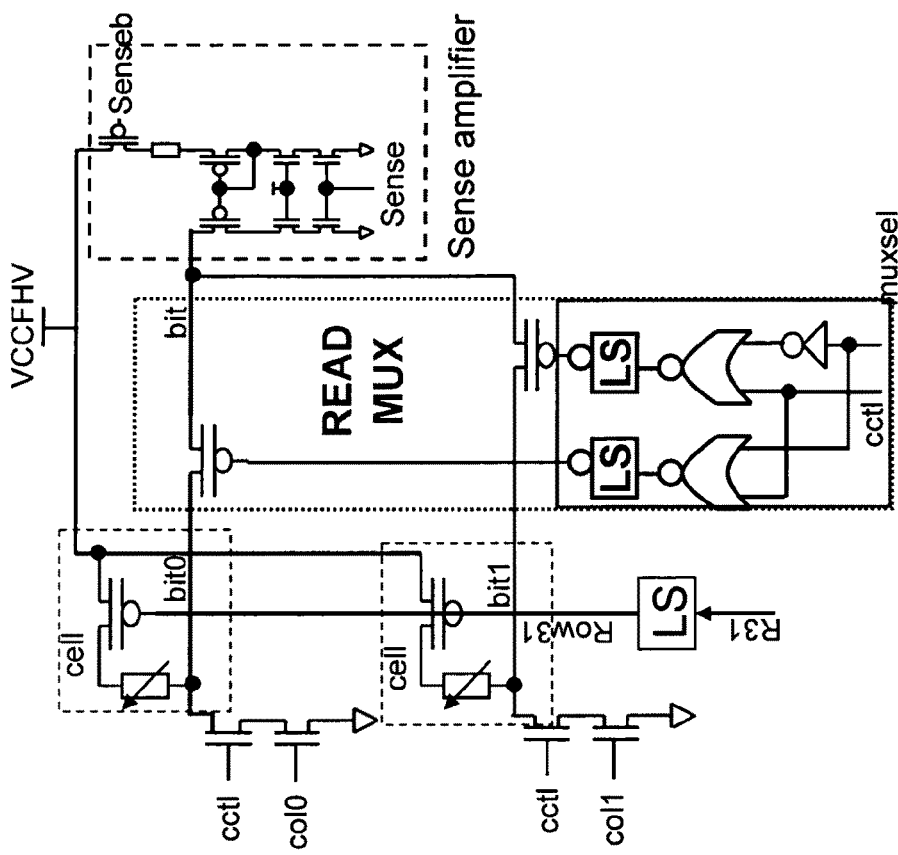
FIG. 7 depicts a multiple column interleaving arrangement whereby multiple columns share the same sense amplifier, in accordance with an embodiment of the present invention.

FIG. 7 depicts a multiple column interleaving arrangement whereby multiple columns share the same sense amplifier, in accordance with an embodiment of the present invention. This configuration can be modified to interleaving of four or more columns. The PMOS transistor (or transmission gate) passes a bit line signal. During sensing, signal cctl is set to 0 and a cell 0/1 is selected based on signal muxsel=0/1 and selecting bit 0 or 1. The shared sense amplifiers may reduce cell area.

Note that either of the PMOS transistors in the READ MUX can be implemented as a transmission gate or NMOS transistor.

Embodiments of the present invention may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments of the present invention. A machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

The drawings and the forgoing description gave examples of the present invention. Although depicted as a number of disparate functional items, those skilled in the art will appreciate that one or more of such elements may well be combined into single functional elements. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An apparatus comprising:
    a plurality of interconnected cells arranged as a column, wherein respective ones of the plurality of cells includes a fuse and a first transistor of a first type, the first transistor including a first terminal, a second terminal, and a third terminal, and the fuse including a fourth terminal and a fifth terminal; and
    a column selection logic coupled to the plurality of cells configured to facilitate selective programming of one or more fuses correspondingly associated with one or more of the plurality of cells,
    wherein the first terminal is coupled to a voltage supply terminal, the second terminal is coupled to the fourth terminal, and the fifth terminal is coupled to the column selection logic,
    wherein the column selection logic includes a second transistor of a second type, and
    wherein one or more first transistors associated with the one or more of the plurality of cells are respectively conductively coupled to the second transistor during programming of the one or more fuses to form one or more conductive paths with reduced parasitic resistances.

2. The apparatus of claim 1, wherein the fuse of at least one of the plurality of cells comprises material selected from one or more of a metal and polysilicon.

3. The apparatus of claim 1, wherein
the third terminal is configured to receive a row select signal to selectively turn on or off the first transistor.

4. The apparatus of claim 3, wherein
the first transistor includes a p-type transistor, wherein the first terminal includes a source terminal, the second terminal includes a drain terminal, and the third terminal includes a gate terminal, and
wherein the second transistor includes a n-type transistor.

5. The apparatus of claim 3, further comprising two or more stacked conductive layers including at least a first metal layer conductively coupled to a second metal layer through a via, and wherein the first terminal of the first transistor of one of the plurality of cells is coupled to the voltage supply terminal through the via.

6. The apparatus of claim 3, wherein the fuse of the each of the plurality of cells is positioned in a plane above a plane in which the corresponding first transistor of the each of the plurality of cells is located.

7. The apparatus of claim 3, wherein the fuse of the each of the plurality of cells is placed in substantially the same plane as that of the corresponding first transistor of the each of the plurality of cells.

8. The apparatus of claim 1, further comprising a plurality of columns of cells, and a plurality of sense amplifiers correspondingly coupled to the plurality of columns of cells to determine programming statuses of one or more fuses.

9. The apparatus of claim 1, further comprising a plurality of columns of cells, and a sense amplifier, and wherein the plurality of columns of cells share the sense amplifier.

10. The apparatus of claim 1, further comprising:
a row selection logic to select a row in the column of cells; and
a level shift logic coupled to the row selection logic to adjust a voltage level applied to a cell in the selected row.

11. The apparatus of claim 1, wherein the column selection logic further includes a third transistor, and the third and the second transistors are n-type transistors.

12. The apparatus of claim 11, wherein the second transistor is configured to receive a column select signal via a gate terminal of the second transistor to turn on the second transistor during programming of the one or more fuses.

13. The apparatus of claim 1, further comprising a column signal generator to generate a column select signal to turn on the second transistor during programming of a fuse.

14. The apparatus of claim 13, wherein the column selection logic further includes a third transistor, and the third transistor is configured to receive a control signal via a gate terminal of the third transistor to turn on the third transistor during programming of the one or more fuses.

15. A method comprising:
receiving a program voltage, from a voltage supply terminal, by each one of a plurality of cells arranged as a column,
wherein the each one of the plurality of cells includes a fuse coupled with a first transistor of a first type, the first transistor including a first terminal, a second terminal, and a third terminal, and the fuse including a fourth terminal and a fifth terminal,
wherein the column of cells is coupled to a column selection logic including a second transistor of a second type, and
wherein the first terminal is coupled to the voltage supply terminal, the second terminal is coupled to the fourth terminal, and the fifth terminal is coupled to the column selection logic; and
switching on or off the second transistor to facilitate programming of one or more fuses of one or more cells among the column of cells,
wherein, during the programming of one or more fuses, one or more corresponding first transistors of the one or more cells are respectively coupled to the second transistor to form one or more conductive paths with reduced parasitic resistances.

16. The method of claim 15, wherein
the first terminal includes a source terminal, the second terminal includes a drain terminal, and the third terminal includes a gate terminal,
wherein said receiving a program voltage includes receiving the program voltage at the source terminal of the first transistor of the each one of the plurality of cells, and
wherein said switching on or off the first transistor further includes receiving a row selection signal at the gate terminal of the first transistor of the cell.

17. The method of claim 16, wherein
the first transistor includes a p-type transistor, and the second transistor includes a n-type transistor.

18. The method of claim 17, wherein the fuse of at least one of the plurality of cells includes material selected from one or more of metal and polysilicon.

19. The method of claim 15, wherein said receiving a program voltage at the first terminal of the first transistor further comprises:
receiving, at the first terminal of the first transistor, the program voltage through a via between two or more conductive layers of a stack.

20. The method of claim 15, further comprising:
receiving a row select signal from a row selection logic to select a row in the column of cells; and
adjusting, by a level shift logic, a voltage level of the row selection signal applied to a cell in the selected row.

21. A system comprising:
a memory device comprising:
a plurality of interconnected cells arranged in a column, wherein respective ones of the plurality of cells include a fuse and a first transistor of a first type, the first transistor including a first terminal, a second terminal, and a third terminal, and the fuse including a fourth terminal and a fifth terminal, and
a column selection logic coupled to the plurality of interconnected cells configured to facilitate selective programming one or more fuses associated with one or more of the plurality of cells,
wherein the first terminal is coupled to a voltage supply terminal, the second terminal is coupled to the fourth terminal, and the fifth terminal is coupled to the column selection logic,
wherein the column selection logic includes a second transistor of a second type, and
wherein one or more first transistors associated with the one or more of the plurality of cells are respectively conductively coupled to the second transistor during programming of the one or more fuses to form one or more conductive paths with reduced parasitic resistances;
a processor coupled to the memory device and configured to further facilitate programming of the memory device; and one or more mass storage devices communicatively coupled to the processor.

22. The system of claim 21, wherein the first terminal includes a source terminal, the second terminal includes a drain terminal, and the third terminal includes a gate terminal, and the gate terminal is configured to receive a row select signal to selectively turn on or off the first transistor.

23. The system of claim 22, wherein the first transistor includes a p-type transistor, and the second transistor includes a n-type transistor.

24. The system of claim 22, wherein the memory device further comprises two or more stacked conductive layers including at least a first metal layer conductively coupled to a second metal layer through a via, and wherein the source terminal of the first transistor of one of the plurality of cells is coupled to the voltage supply terminal through the via.

\* \* \* \* \*